United States Patent [19]
El-Sharawy et al.

[11] Patent Number: 6,104,631
[45] Date of Patent: Aug. 15, 2000

[54] STATIC MEMORY CELL WITH LOAD CIRCUIT USING A TUNNEL DIODE

[75] Inventors: El-Badawy Amien El-Sharawy, Gilbert, Ariz.; Majid M. Hashemi, Sunnyvale, Calif.

[73] Assignee: National Scientific Corp., Phoenix, Ariz.

[21] Appl. No.: 08/991,966

[22] Filed: Dec. 17, 1997

[51] Int. Cl.$^7$ ............................................. G11C 11/34
[52] U.S. Cl. .................... 365/154; 365/188; 365/104; 365/72; 365/115; 365/175
[58] Field of Search .................. 365/189.01, 154, 365/188, 104, 115, 175

[56] References Cited

U.S. PATENT DOCUMENTS

| | | | |
|---|---|---|---|
| 4,901,279 | 2/1990 | Plass | 365/154 |
| 5,487,037 | 1/1996 | Lee | 365/189.11 |
| 5,526,304 | 6/1996 | Kawamura | 365/154 |
| 5,724,292 | 3/1998 | Wada | 365/207 |
| 5,745,407 | 4/1998 | Levy et al. | 365/159 |
| 5,751,630 | 5/1998 | Roberts | 365/154 |
| 5,757,696 | 5/1998 | Matsuo et al. | 365/185.07 |
| 5,771,190 | 6/1998 | Okamura | 365/154 |
| 5,986,923 | 11/1996 | Zhang et al. | 365/154 |

FOREIGN PATENT DOCUMENTS

| | | |
|---|---|---|
| 405315571A | 11/1993 | Japan . |
| 406085206A | 3/1994 | Japan . |

*Primary Examiner*—Viet Q. Nguyen
*Attorney, Agent, or Firm*—Lowell W. Gresham, Esq.; Jordan M. Meschkow, Esq.; Meschkow & Gresham, P.L.C.

[57] ABSTRACT

A static RAM memory cell (30) uses cross-coupled enhancement mode, N-channel MOS drive transistors (36) to form a bistable flip-flop. A load circuit (34) couples between I/O ports (40) of the drive transistors (36) and Vcc. For each drive transistor (36), the load circuit includes a depletion mode, N-channel MOS load transistor (54) and a forward biased tunnel diode (32). The drain and gate of the load transistor (54) couple across the anode and cathode of the tunnel diode (32) so that the forward voltage ($V_f$) of the tunnel diode (32) controls the $V_{gs}$ transfer curve (56) of the load transistor.

20 Claims, 3 Drawing Sheets

STATIC MEMORY CELL WITH LOAD CIRCUIT USING A TUNNEL DIODE

TECHNICAL FIELD OF THE INVENTION

The present invention relates generally to semiconductor memory devices. More particularly, the present invention relates to static random access memory (RAM) cells that use tunnel diodes.

BACKGROUND OF THE INVENTION

Static semiconductor RAM devices include a multiplicity of memory cells, wherein each memory cell stores a single bit of data so long as the RAM device remains energized. Static memory differs from dynamic memory in that data stored in the static memory remains valid without the need for refreshing. A continuing need exists for memory cells that can be implemented in smaller semiconductor die area. Smaller memory cells lead to semiconductor memory circuits which are capable of storing more data and are often faster devices. However, shrinking a memory cell without impairing stability, speed, yield or power consumption parameters is a difficult task.

FIG. 1 shows a schematic diagram of conventional variations of a static RAM (SRAM) cell. A basic memory cell 10 includes cross-coupled drivers 12. Each driver 12 has an I/O port 14, and drivers 12 together form a bistable storage element that stores a single bit of data. Pass transistors 16 couple I/O ports 14 to bit (B) and bit-bar (B̄) lines 18 and word lines (W) 20. Drivers 12 couple to Vss, and loads 22 couple between Vcc and drivers 12. Conventional variations in memory cell 10 differ from one another in their configurations for loads 22.

One prior art memory cell 10 uses resistors 24 for loads 22. When resistors 24 are used for loads 22, memory cell 10 is referred to as a four-transistor memory cell. Lower valued resistors 24 are desirable in order to improve yield, reliability, and area requirements. In addition, lower valued resistors 24 promote stability and greater immunity to noise when the drive transistors 12 for which they are loads are in "off" states. Unfortunately, higher valued resistors are desirable to reduce standby power consumption and to improve the speed of operation. Moreover, higher valued resistors promote stability and greater noise immunity when the drive transistors 12 for a which they are loads are in "on" states.

No single resistor value of a four-transistor memory cell promotes stability and noise immunity for both states of drive transistors 12. Further, as cell size shrinks, reduced power consumption becomes more important for purposes of heat dissipation because a given amount of power is dissipated over the cell's die area. Accordingly, the use of resistive loads in memory cell 10 leads to undesirably high standby power consumption and to worsened stability, speed, yield and/or reliability characteristics as cell size shrinks.

Another prior art memory cell 10 uses P-channel transistors 26 for loads 22. When P-channel or other transistors are used for loads 22, memory cell 10 is referred to as a six-transistor memory cell. P-channel transistors 26 solve many of the problems associated with resistors 24. P-channel transistor 26 memory cell implementations consume a moderately low amount of power and can be manufactured reliably. However, P-channel transistors 26 require an undesirably large die area. A P-channel transistor typically requires the formation of an N-well diffusion into the substrate in which the P-type drain and source diffusions are formed, and this N-well diffusion occupies a large area. Moreover, the channel itself is typically larger than in a corresponding N-channel transistor due to lower hole mobility for the P-channel device.

In addition, P-channel loads 26 cause the memory cells to experience current spikes for brief instants when both drive and load transistors are at least partially in their "on" states. The current spikes contribute to an undesirable package resonance effect and slow memory cell access, particularly for write operations. Accordingly, while P-channel transistor loads 26 work well for many purposes, P-channel transistors 26 are too large for use in small memory cells and experience excessive current spikes which slow operation and increase power consumption above theoretical levels.

Another prior art memory cell 10 uses depletion mode, N-channel transistors 28 for loads 22. Depletion mode, N-channel transistors 28 are smaller than P-channel transistors 26, but experience problems similar to those experienced by resistors 24. In particular, depletion mode transistors 28 are characterized by high power in their "off" state. Processes which minimize this power consumption parameter cause yield problems. Moreover, a body effect causes a depletion mode transistor to continuously, rather than discretely or distinctly, transition between "on" and "off" states. This continuous transition feature leads to undesirable switching noise, current spikes, and slow access times.

Another prior art memory cell (not shown) uses a tunnel diode as a storage element. A tunnel diode has two distinct operating regions. A first operating region occurs at a low forward voltage, typically less than 0.1 volts. A second operating region occurs at a higher forward voltage, typically greater than 0.6 volts. The region between these two operating regions (i.e. typically around 0.1–0.6 volts) is an unstable region in which the device exhibits a negative resistance. A tunnel diode acts as a storage element by distinctly operating in either the first region or the second region. While a tunnel diode storage element exhibits desirable size and power characteristics, it is not a stable device. In other words, the tunnel diode storage element too easily switches to its other region of operation when a device incorporating such elements experiences a range of temperatures and read-write operations over time, as occurs in normal memory circuits. Because of stability problems, memory cells using tunnel diodes as storage elements have not proven themselves to be commercially viable.

SUMMARY OF THE INVENTION

Accordingly, it is an advantage of the present invention that an improved static memory cell with a load circuit that uses a tunnel diode is provided.

Another advantage of the present invention is that a static memory cell is provided that can use only N-channel transistors.

Another advantage of the present invention is that a static memory cell is provided that uses a tunnel diode to improve the power consumption and switching characteristics of a depletion mode transistor.

Another advantage of the present invention is that a static memory cell is provided that can be implemented in a small area.

Another advantage of the present invention is that a high speed, high density static memory cell is provided.

The above and other advantages of the present invention are carried out in one form in a static memory cell. The memory cell includes first and second drive transistors. Each of the first and second drive transistors has an input/output (I/O) port and a control port. The first drive transistor I/O port couples to the second drive transistor control port, and the second drive transistor I/O port couples to the first transistor control port. The first and second drive transistors together form a bistable flip-flop. A load circuit includes a load transistor having a controlling input and a controlled port. The controlling input is coupled to the I/O port of the first drive transistor. A tunnel diode is coupled in series between the controlled port of the load transistor and the I/O port of said first drive transistor.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
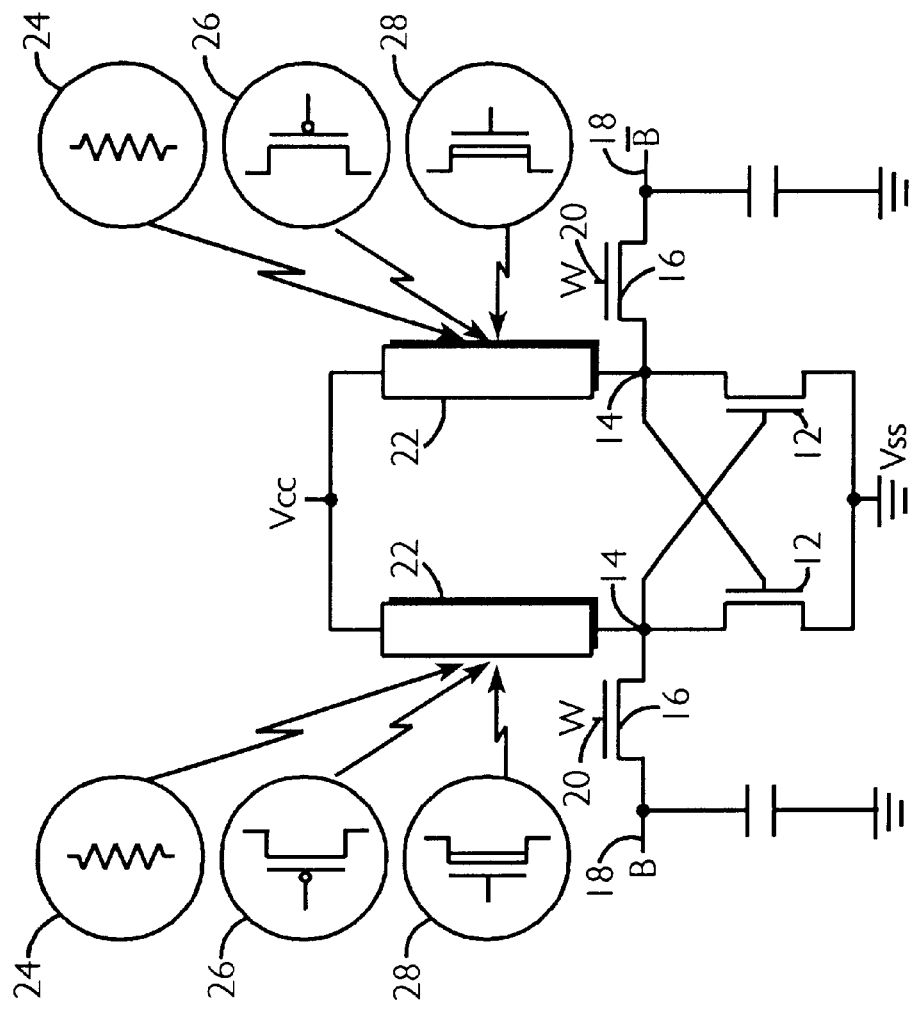
FIG. 1 shows a schematic diagram of prior art variations to a memory cell.
Figure 2:
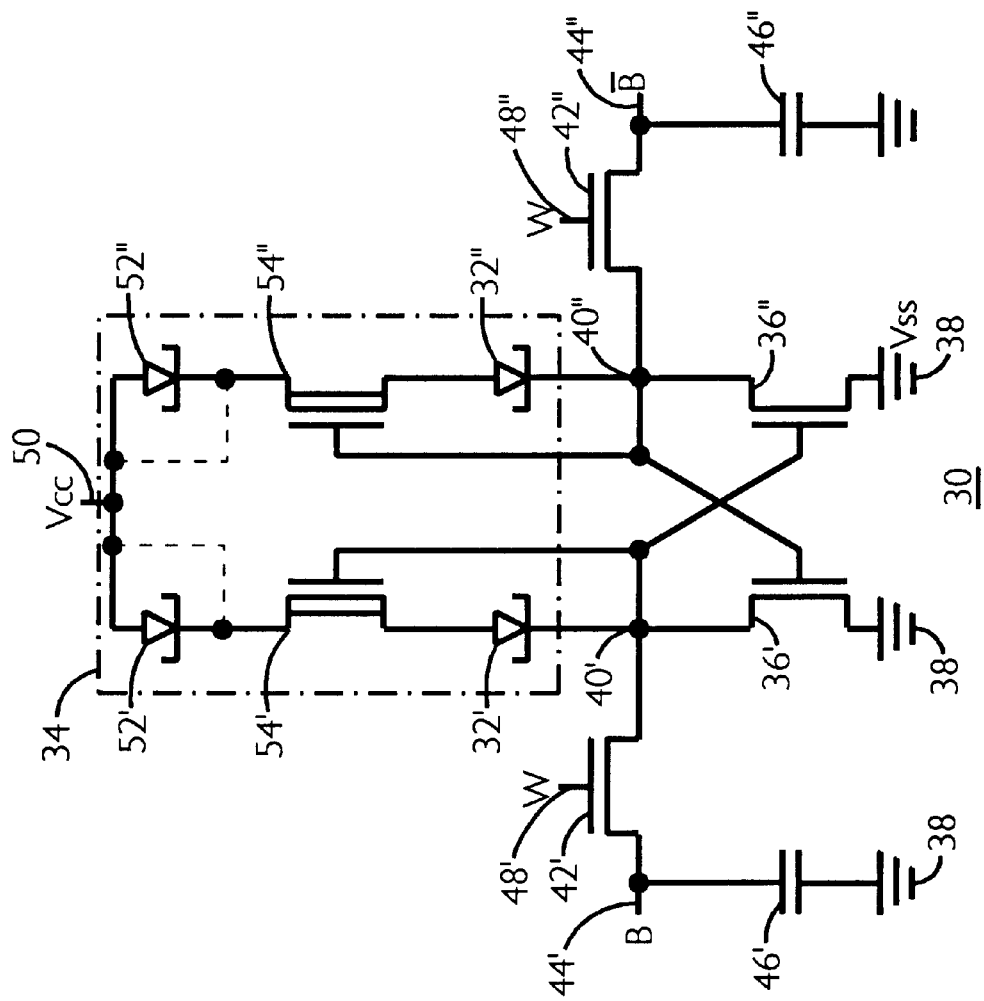
FIG. 2 shows a schematic diagram of a memory cell that uses a tunnel diode in a load circuit in accordance with the teaching of the present invention.

FIG. 2 shows a schematic diagram of a memory cell 30 that uses a tunnel diode 32 in a memory cell load circuit 34 in accordance with the teaching of the present invention. Memory cell 30 is a symmetrical circuit in which each component has a symmetrical counterpart. In the Figures and this description, the components are distinguished from their counterparts through prime (') and double-prime (") suffixes in their respective reference numbers. Reference numbers used herein without suffixes indicate either a component or its counterpart individually or both components collectively.

Memory cell 30 includes a bistable flip-flop formed from drive transistors 36. Drive transistors 36 are desirably enhancement mode, N-channel metal oxide semiconductor (MOS) field effect transistors (FETs) fabricated using conventional semiconductor processing techniques. A gate of a drive transistor 36' couples to a drain of a drive transistor 36", and a gate of drive transistor 36" couples to a drain of drive transistor 36'. Sources for each of drive transistors 36 couple to a terminal 38 adapted to receive a lower common potential, referred to herein as Vss or as ground.

The drains of drive transistors 36 serve as input/output (I/O) ports 40 for drive transistors 36. I/O ports 40 of drive transistors 36 respectively couple to first controlled ports of pass transistors 42, and second controlled ports of pass transistors 42 respectively couple to bit lines 44. Bit-bar ($\overline{B}$) line 44" conveys an opposite polarity bit to that conveyed by bit (B) line 44'. Capacitors 46 are illustrated in FIG. 2 as being respectively coupled between bit lines 44 and ground terminal 38 to indicate intrinsic capacitance present in the semiconductor device within which memory cell 30 resides. Capacitors 46 are desirably not lumped elements within this device. Controlling inputs of pass transistors 42 respectively connect to word lines (W) 48.

Pass transistors 42 are desirably enhancement mode, N-channel metal oxide semiconductor (MOS) field effect transistors (FETs) fabricated using the same conventional semiconductor processing techniques used to form drive transistors 36. Accordingly, the controlled ports of pass transistors 42 are sources and drains, and the controlling ports are gates. Bit lines 44 and word lines 48 couple memory cell 30 with other similar memory cells 30 in a manner well known to those skilled in the design and fabrication of SRAM semiconductor devices.

Load circuit 34, shown within dotted lines in FIG. 2, couples to the bistable flip-flop at I/O ports 40 and to a terminal 50 adapted to receive a higher common potential, referred to herein as Vcc. In particular, Vcc terminal 50 couples to anodes of forward biased smaller tunnel diodes 52' and 52". Cathodes of smaller tunnel diodes 52 respectively couple to first controlled ports of load transistors 54. In an alternate embodiment which is discussed in more detail below, smaller tunnel diodes 52 are omitted, and Vcc terminal 50 directly couples to the first controlled ports of both load transistors 54, as indicated by dotted lines in FIG. 2. Second controlled ports of load transistors 54 respectively couple to anodes of forward biased larger tunnel diodes 32. Cathodes of larger tunnel diodes 32 and controlling inputs of load transistors 54 respectively couple to I/O ports 40. Accordingly, larger tunnel diodes 32 are forward biased and coupled in series between controlled ports of load transistors 54 and I/O ports 40 of drive transistors 36.

Load transistors 54 are desirably depletion mode, N-channel metal oxide semiconductor (MOS) field effect transistors (FETs). Load transistors 54 are desirably fabricated using conventional semiconductor processing techniques that are compatible with the fabrication of N-channel enhancement mode transistors 36 and 42. The first controlled ports of load transistors 54 are drains, the second controlled ports of load transistors 54 are sources, and the controlling inputs of load transistors 54 are gates. Since load transistors 54 are N-channel devices, no N-well diffusions are required, and they can be fabricated using substantially an equivalent small amount of semiconductor die area per transistor as that required for drive and pass transistors 36 and 42.

Tunnel diodes 32 and 52 are also fabricated using conventional semiconductor processing techniques compatible with the fabrication of MOS transistors 36, 42, and 54. Those skilled in the art will appreciate that both sides of the junctions which form tunnel diodes 32 and 52 are highly doped in excess of $1 \times 10^{19}$ so as to be considered degenerate semiconductors. Desirably, each larger tunnel diode 32 is fabricated to overlie the drain of its corresponding drive transistor 36 or pass transistor 42, and each smaller tunnel diode 52 is fabricated to overlie the drain of its corresponding load transistor 54. This may increase the size of the corresponding drain an insubstantial amount to accommodate contacts, but otherwise requires no additional die area for the fabrication of tunnel diodes 32 and 52.

Tunnel diodes 32 and 52 may be directly formed in the corresponding drains by ion implantation of heavily doped P type dopant into the respective drain regions. This direct implantation technique is advantageous because it requires few extra processing steps beyond those required to fabricate MOS transistors 36, 42, and 54. Alternatively, tunnel diodes 32 and 52 may be isolated from the corresponding drains by depositing undoped polysilicon over the respective drain regions, recrystallizing the polysilicon into a single crystal, then implanting the recrystallized silicon with heavily doped P type dopant. While extra steps may be required, density improvements result. Alternatively, tunnel diodes 32 and 52 may be formed at any location deemed prudent for a particular application. Such alternate locations include forming tunnel diodes 32 over the sources of transistors 42.

In the preferred embodiments, smaller tunnel diodes 52 are typically 70–90% of the size of larger tunnel diodes 32. This causes the forward peak current parameter ($I_{p0}$) of smaller tunnel diodes 52 to be lower than the forward peak current parameter ($I_{p1}$) of larger tunnel diodes 32, as is more fully discussed below in connection with FIG. 4.

Figure 3:
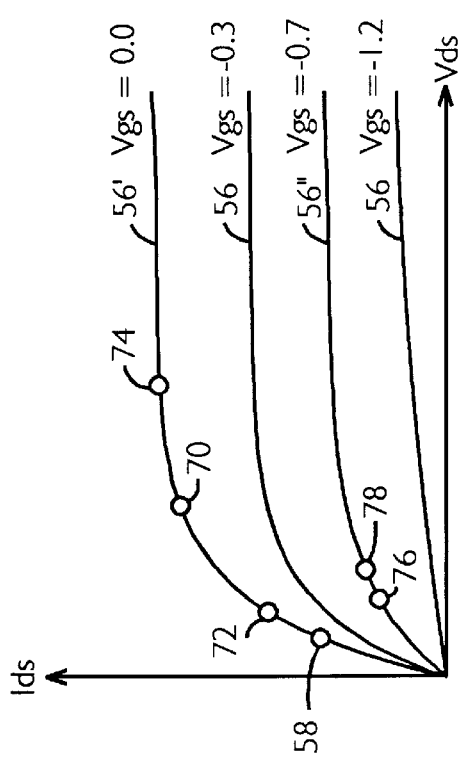
FIG. 3 shows a family of transfer curves that depict an exemplary operation of a depletion mode transistor portion of a memory cell load circuit and various operating points realized on these curves as a memory cell drive transistor switches from "off" to "on" states.

FIG. 3 shows a family of transfer curves 56 that depict an exemplary operation of depletion mode load transistors 54 at various operating points realized on curves 56 as corresponding enhancement mode drive transistors 36 switch from "off" to "on" states. Referring to FIGS. 2 and 3, the below-presented discussion may be viewed as referring to either one circuit "chain" which includes smaller tunnel diode 52', load transistor 54', larger tunnel diode 32', and drive transistor 36" or to another circuit chain that includes smaller tunnel diode 52", load transistor 54", larger tunnel diode 32", and drive transistor 36". When drive transistor 36" is switching from "off" to "on" states, the other drive transistor 36" is switching from "on" to "off" states, and vice-versa. Accordingly, the below presented discussion omits reference number suffixes which distinguish one chain from the other to describe the operation of both chains, depending upon the state of memory cell 30.

Figure 4:
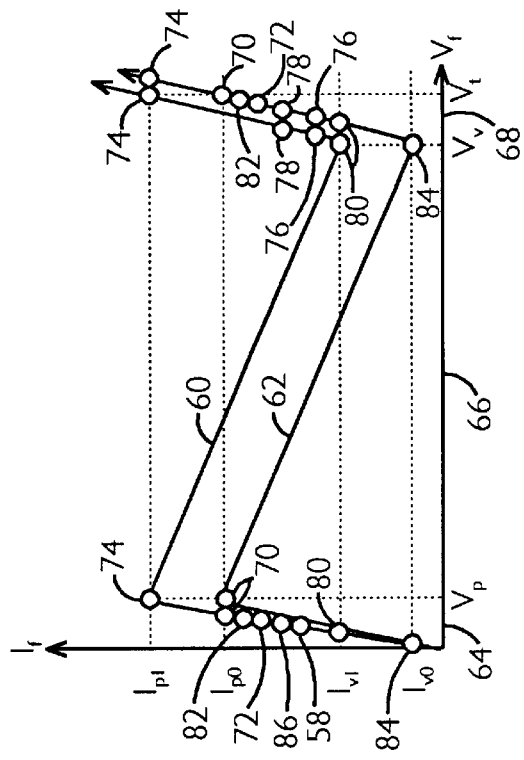
FIG. 4 shows transfer curves that depict exemplary operation of different tunnel diodes included in the load circuit.

Curves 56 depict an exemplary set of transfer characteristics for depletion mode load transistor 54 at various gate-to-source voltages ($V_{gs}$). Starting at an initial steady state condition where drive transistor 36 is "off", I/O port 40 is at a high voltage, and the voltage across this chain of load circuit 34 is low. Accordingly, both $V_{gs}$ and $V_{ds}$ are near 0 volts and a transfer curve 56' describes the operation of load transistor 54. In particular, load transistor 54 operates around a point 58 on curve 56'. The low $V_{gs}$ and $V_{ds}$ values cause load transistor 54 to draw only a small amount of current ($I_{ds}$). FIG. 4 shows transfer curves 60 and 62 that depict exemplary characteristics of tunnel diodes 32 and 52, respectively. Operating point 58 is also depicted on curves 60 and 62. In this steady state condition, a little current flows through tunnel diodes 32 and 52, and very little forward voltage ($V_f$) is developed across tunnel diodes 32 and 52. The low $I_{ds}$ and low $V_{ds}$ and $V_f$ values that characterize this steady state condition mean that only a very small amount of standby power is consumed.

Transfer curves 60 and 62 show three distinct regions in which tunnel diodes 32 and 52 operate. A region 64 occurs when tunnel diode $V_f$ is between 0 and a peak voltage ($V_p$) and forward current ($I_f$) is between 0 and the peak forward current ($I_p$). In silicon tunnel diodes, $V_p$ typically occurs at around 0.065 V. Operating point 58 resides in region 64. A region 66 occurs when tunnel diode $V_f$ is between $V_p$ and a valley voltage ($V_v$). Region 66 is an unstable negative differential resistance region in which $I_f$ decreases to a low valley current ($I_v$) as $V_f$ increases to $V_v$. In silicon tunnel diodes, $V_v$ typically occurs at around 0.42 V. A region 68 occurs when tunnel diode $V_f$ is greater than $V_v$. In region 68 $I_f$ increases with increasing $V_f$. As the $I_f$ conducted through tunnel diodes 32 and 52 increases from zero, $V_f$ instantly snaps or steps from $V_p$ in region 64 to a transfer voltage ($V_t$) in region 68 when $I_f$ reaches $I_p$. In silicon tunnel diodes, $V_t$ typically occurs at around 0.70 V. At $V_p$, the tunnel diode conducts the same amount of current (i.e. $I_p$) it was conducting before the snap. This snap or step in $V_f$ results from a tunneling phenomena that occurs at the speed of light. Accordingly, the snap need require only a small fraction of a nanosecond to complete.

Referring to FIGS. 2–4, when drive transistor 36 switches from its "off" state to its "on" state, the voltage at I/O port 40 drops toward Vss causing the voltage across load circuit 34 to increase. As the voltage across load circuit 34 increases, the operating point of load transistor 54 moves upward along curve 56', and load transistor 54 draws more current. This increasing current causes tunnel diodes 32 and 52 to approach their peak forward current values $I_p$. At an operating point 70 on transfer curve 56', the current reaches $I_{p0}$ for smaller tunnel diode 52, referenced as $I_{p0}$ in FIG. 4.

At $I_{p0}$, the voltage across smaller tunnel diode 52 snaps from $V_p$ to $V_t$, causing $V_{ds}$ for load transistor 54 to instantly drop by approximately 0.6 V and current $I_{ds}$ to decrease. Accordingly, immediately after smaller tunnel diode 52 snaps to $V_t$, operating point 72 is realized. Operating point 72 resides in region 68 of smaller tunnel diode curve 62 and in region 64 of larger tunnel diode curve 60.

As the voltage at I/O port 40 drops even further toward Vss, $V_{ds}$ and $I_{ds}$ again both increase along curve 56'. Eventually, $I_{ds}$ reaches $I_p$ for larger tunnel diode 32, referenced as $I_{p1}$ in FIG. 4, and an operating point 74 is realized. At $I_{p1}$, the voltage across larger tunnel diode 32 snaps from $V_p$ to $V_t$ causing $V_{ds}$ for load transistor 54 to again drop by approximately 0.6 V and causing $V_{gs}$ for load transistor 54 to drop to approximately –0.7 V. This drop in $V_{gs}$ to around –0.7 V instantly causes load transistor 54 to exhibit transfer characteristics similar to those identified by curve 56" in FIG. 3. $I_{ds}$ is lowered by the transfer characteristics of curve 56" relative to transfer characteristics of curve 56", and the drop in $V_{ds}$ of load transistor 54 causes further lowering of $I_{ds}$ along curve 56". Accordingly, immediately after larger tunnel diode 32 snaps to $V_t$, an operating point 76 is realized.

From operating point 76, $V_{ds}$ and $I_{ds}$, both increase along curve 56". Desirably, Vcc is selected in cooperation with the characteristics of transistors 36 and 54 so that drive transistor 36 goes into saturation soon after operating point 76 is reached. Accordingly, an operating point 78 is realized at a steady state condition where drive transistor 36 is in its "on" state. At operating point 78, little standby power is consumed because little current flows through this chain of load circuit 34.

At steady state operating point 78, load transistor 54 operates on curve 56" and tunnel diodes 32 and 52 both operate in their third regions 68. In contrast, at steady state operating point 58 load transistor 54 operates on curve 56' and tunnel diodes 32 and 52 both operate in their first regions 64. Consequently, load circuit 34 exhibits a relatively high dynamic resistance for operating point 78 and a relatively low dynamic resistance for operating point 58. Dynamic resistance refers to the resistance exhibited 10 at an operating point from small changes in current or voltage.

This difference in dynamic resistance at the steady state operating points promotes stability. The lower dynamic resistance of operating point 58, where I/O port 40 exhibits a high level and drive transistor 36 is "off", causes a given current spike to have a smaller influence on the voltage at I/O port 40. The higher dynamic resistance of operating point 78, where I/O port 40 exhibits a low level and drive transistor 36 is in saturation, again causes a given current spike to have a smaller influence on the voltage at I/O port 40.

Certain design considerations are desirably met in the fabrication of load transistor 54 and tunnel diodes 32 and 52. As discussed above, when smaller tunnel diode 52 snaps to move operation from point 70 in region 64 to point 72 in region 68, $I_{ds}$ decreases due to a drop in $V_{ds}$ across load transistor 54. This causes $I_f$ through smaller tunnel diode 52 to decrease toward a valley current ($I_{v0}$). Desirably, the gain of load transistor 54 is sufficiently low that operating point 72 does not reach $I_{v0}$. Further decrease in current below Io would cause smaller tunnel diode 52 to snap to region 64 and an undesirable oscillating condition could be established. Those skilled in the art of semiconductor design and fabrication can easily insure that the gain of transistor 54 is not so high as to risk oscillation.

Likewise, when larger tunnel diode 32 snaps to move operation from point 74 in region 64 to point 76 in region 68, $I_{ds}$ again decreases due to both the drop in $V_{gs}$ across load transistor 54 and a drop in $V_{ds}$ across load transistor 54. This causes $I_f$ through larger tunnel diode 32 to decrease toward a valley current ($I_{v1}$). Desirably, the gain of load transistor 54 is sufficiently low that operating point 76 does not reach $I_{v1}$. Further decrease in current below $I_{v1}$ would cause larger tunnel diode 32 to snap to region 64 and an undesirable oscillating condition could be established. Those skilled in the art of semiconductor design and fabrication can easily insure that the gain of transistor 54 is not so high so as to risk oscillation.

These design considerations provide the basis for including smaller tunnel diode 52 in load circuit 34. The snapping of smaller tunnel diode 52 and the resulting lowering of $V_{ds}$ for load transistor 54 reduces the effective gain of transistor 54 just before larger diode 32 snaps.

Accordingly, this reduces the likelihood of operating point 76 reaching $I_v$ in region 68. While smaller tunnel diode 52 improves the robustness of memory cell 30 for a variety of operating conditions, it is not a necessity. Smaller tunnel diode 52 may be omitted where good processing control of the gain for load transistor 54 can be assured and where an application, such as a battery powered application, may not have sufficient Vcc to tolerate the voltage drop across smaller tunnel diode 52.

Figure 5:
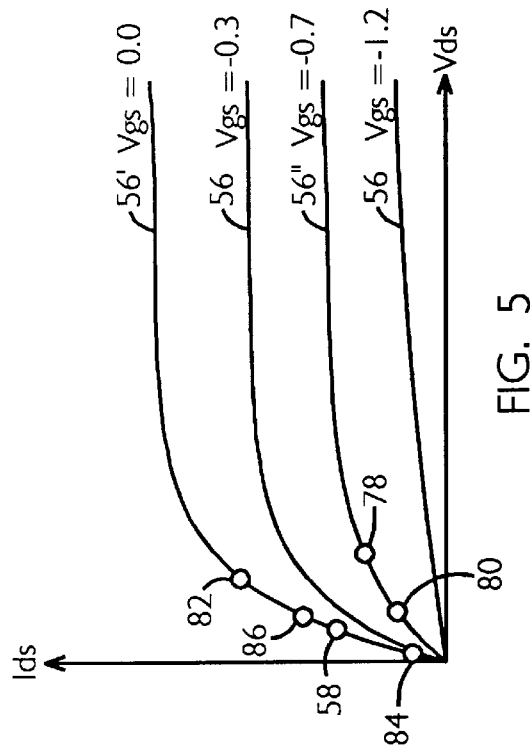
FIG. 5 shows the family of transfer curves from FIG. 3 with various operating points realized as the memory cell drive transistor switches from "on" to "off" states.

FIG. 5 shows the same transfer curves 56 for load transistor 54 as those illustrated in FIG. 3. However, FIG. 5 depicts various operating points that are realized as drive transistor 36 switches from its "on" condition to its "off" condition. Operating point 78 reflects the steady state "on" condition for drive transistor 36.

Referring to FIGS. 2, 4, and 5, when drive transistor 36 switches from its "on" state to its "off" state, the voltage at I/O port 40 is pulled up toward Vss causing the voltage across this chain of load circuit 34 to decrease. As the voltage across load circuit 34 decreases, the operating point of load transistor 54 moves downward along curve 56", and load transistor 54 draws less current. This decreasing current causes tunnel diodes 32 and 52 to approach their $I_v$ values. At an operating point 80, the current reaches $I_{v1}$ for larger tunnel diode 32.

At $I_{v1}$ the voltage across larger tunnel diode 32 snaps from $V_v$ to $V_p$, causing $V_{ds}$ and $V_{gs}$ for load transistor 54 to instantly increase by approximately 0.4 V. This snap instantly increases $V_{gs}$ to around 0.0 V and causes load transistor 54 to exhibit transfer characteristics approximately identified by curve 56'. $I_{ds}$ increases due to the transfer characteristics of curve 56' versus the characteristics of curve 56", and the increase in $V_{ds}$ of load transistor 54 causes a further increase in $I_{ds}$ along curve 56'. Accordingly, immediately after larger tunnel diode 32 snaps to $V_p$, an operating point 82 is realized.

As the voltage at I/O port 40 continues to increase further toward Vcc, $V_{ds}$ and $I_{ds}$ both decrease along curve 56'. Eventually, $I_{ds}$ reaches $I_{v0}$ for smaller tunnel diode 52, and an operating point 84 is realized. At $I_{v0}$, the voltage across smaller tunnel diode 52 snaps from $V_v$ to $V_p$ causing $V_{ds}$ and $V_{gs}$ for load transistor 54 to again increase by approximately 0.4 V. The instant increase in $V_{ds}$ of load transistor 54 causes an increase in $I_{ds}$ along curve 56'. Accordingly, immediately after smaller tunnel diode 52 snaps to $V_p$, an operating point 86 is realized.

From operating point 86, $V_{ds}$ and $I_{ds}$ both decrease along curve 56' as the voltage of I/O port 40 continues to rise. Accordingly, operating point 58 is realized at a steady state condition where drive transistor 36 is in its "off" state.

As should be apparent from the above-presented discussion, a large portion of the voltage swings that occur while I/O port 40 changes from high to low and low to high states occurs in response to tunnel diode snaps. These snapping events occur extremely fast. Consequently, I/O ports 40 change states extremely fast. Because these state changes occur so quickly, little power is actually consumed during the high current transitions between these states.

Moreover, because these state changes occur so quickly, little switching noise results. Switching noise occurs when both drive and load transistors 36 and 54 are conducting for an instant during the transition between states. Since the transition between states happens so quickly, this instant of both transistors conducting is exceedingly brief, and an opportunity for a current spike to build is very limited. The small amount of switching noise generated by memory cell 30 leads to reduced package resonance and an ability to perform write operations quickly.

In summary, the present invention provides an improved static memory cell with a load circuit that uses a tunnel diode. A static memory cell is provided that can use only N-channel transistors. Thus, the memory cell can be fabricated in a very small semiconductor die area, and a high density memory device can utilize a multiplicity of the memory cells. A tunnel diode is used in conjunction with a depletion mode load transistor to improve the power consumption and switching characteristics of the depletion mode transistor. The use of the tunnel diode results in fast switching times, reduced power consumption, reduced switching noise, and reduced writing times.

The present invention has been described above with reference to preferred embodiments. However, those skilled in the art will recognize that changes and modifications may be made in these preferred embodiments without departing from the scope of the present invention. These and other changes and modifications which are obvious to those skilled in the art are intended to be included within the scope of the present invention.

What is claimed is:

1. In a static memory cell which includes a first drive transistor having an input/output (I/O) port and a control port and a second drive transistor having an I/O port coupled to said control port of said first drive transistor and a control port coupled to said I/O port of said first drive transistor, said first and second drive transistors forming a bistable flip-flop, a load circuit comprising:

a load transistor having a controlling input and a controlled port, said controlling input being coupled to said I/O port of said first drive transistor; and a tunnel diode coupled in series between said controlled port of said load transistor and said I/O port of said first drive transistor.

2. A static memory cell load circuit as claimed in claim 1 wherein said load transistor is a first load transistor, said tunnel diode is a first tunnel diode, and said load circuit additionally comprises:

a second load transistor having a controlling input and a controlled port, said second load transistor controlling input being coupled to said I/O port of said second drive transistor; and a second tunnel diode coupled in series between said controlled port of said second load transistor and said I/O port of said second drive transistor.

3. A static memory cell load circuit as claimed in claim 1 wherein said tunnel diode is coupled to said load transistor and said drive transistor so as to be forward biased.

4. A static memory cell load circuit as claimed in claim 1 wherein said load transistor is configured to operate in a depletion mode.

5. A static memory cell load circuit as claimed in claim 4 wherein each of said drive transistors is configured to operate in an enhancement mode.

6. A static memory cell load circuit as claimed in claim 1 wherein:

said load transistor is an N channel metal oxide semiconductor (MOS) field effect transistor (FET);

said controlling input of said load transistor is a gate of said FET; and said controlled port of said load transistor is a source of said FET.

7. A static memory cell load circuit as claimed in claim 6 wherein:

each of said first and second drive transistors is an N channel MOS FET;

each of said control ports of said first and second drive transistors is a gate; and each of said I/O ports of said first and second drive transistors is a drain.

8. A static memory cell load circuit as claimed in claim 1 wherein:

said tunnel diode is a first tunnel diode;

said load transistor additionally has a second controlled port; and said load circuit additionally comprises a second tunnel diode coupled to said second controlled port of said load transistor.

9. A static memory cell load circuit as claimed in claim 8 wherein said first tunnel diode is configured to exhibit a larger forward peak current parameter ($I_p$) than is exhibited by said second tunnel diode.

10. A static memory cell load circuit as claimed in claim 9 wherein said first tunnel diode is configured to occupy a larger area than is occupied by said second tunnel diode.

11. A static memory cell load circuit as claimed in claim 1 additionally comprising:

a first pass transistor coupled to said first drive transistor I/O port; and a second pass transistor coupled to said second drive transistor I/O port.

12. In a static memory cell which includes a first enhancement mode drive transistor having an input/output (I/O) port and a control port and a second enhancement mode drive transistor having an I/O port coupled to said control port of said first drive transistor and a control port coupled to said I/O port of said first drive transistor, said first and second drive transistors forming a bistable flip-flop, a load circuit comprising:

a depletion mode load transistor having a controlling input and a controlled port, said controlling input being coupled to said I/O port of said first drive transistor; and a tunnel diode having an anode coupled to said controlled port of said load transistor and a cathode coupled to said controlling input of said load transistor.

13. A static memory cell load circuit as claimed in claim 12 wherein said load transistor is a first load transistor, said tunnel diode is a first tunnel diode, and said load circuit additionally comprises:

a second depletion mode load transistor having a controlling input and a controlled port, said second load transistor controlling input being coupled to said I/O port of said second drive transistor; and a second tunnel diode having an anode coupled to said controlled port of said second load transistor and a cathode coupled to said controlling input of said second load transistor.

14. A static memory cell load circuit as claimed in claim 12 wherein:

said load transistor is an N channel metal oxide semiconductor (MOS) field effect transistor (FET);

said controlling input of said load transistor is a gate of said FET; and said controlled port of said load transistor is a source of said FET.

15. A static memory cell load circuit as claimed in claim 14 wherein:

each of said first and second drive transistors is an N channel MOS FET;

each of said control ports of said first and second drive transistors is a gate; and each of said I/O ports of said first and second drive transistors is a drain.

16. A static memory cell load circuit as claimed in claim 12 wherein:

said tunnel diode is a first tunnel diode;

said load transistor additionally has a second controlled port; and said load circuit additionally comprises a second tunnel diode coupled to said second controlled port of said load transistor.

17. A static memory cell load circuit as claimed in claim 16 wherein said first tunnel diode is configured to exhibit a larger forward peak current parameter ($I_p$) than is exhibited by said second tunnel diode.

18. A static memory cell comprising:

a first enhancement mode drive field effect transistor (FET) having a gate, a drain, and a source, said source being adapted to receive a first common potential;

a second enhancement mode drive FET having a gate coupled to said drain of said first drive FET, a drain coupled to said gate of said first drive FET, and a source adapted to receive said first common potential;

a first tunnel diode having a cathode coupled to said drain of said first drive FET and having an anode;

a second tunnel diode having a cathode coupled to said drain of said second drive FET and having an anode;

a first depletion mode load FET having a gate coupled to said drain of said first drive FET, having a source coupled to said anode of said first tunnel diode, and having a drain;

a second depletion mode load FET having a gate coupled to said drain of said second drive FET, having a source coupled to said anode of said second tunnel diode, and having a drain;

a third tunnel diode having a cathode coupled to said drain of said first load FET and having an anode adapted to receive a second common potential; and a fourth tunnel diode having a cathode coupled to said drain of said second load FET and having an anode adapted to receive said second common potential.

19. A static memory cell as claimed in claim 18 wherein said first and second tunnel diodes are configured to exhibit larger forward peak current parameters ($I_p$) than are exhibited by said third and fourth tunnel diodes, respectively.

20. A static memory cell as claimed in claim 18 wherein:

each of said drive FETs is an N channel MOS device; and each of said load FETs is an N channel MOS device.

\* \* \* \* \*